(12) United States Patent
Kremer

(10) Patent No.: US 11,312,073 B2
(45) Date of Patent: Apr. 26, 2022

(54) APPARATUS FOR ADDITIVELY MANUFACTURING OF THREE-DIMENSIONAL OBJECTS

(71) Applicant: CONCEPT LASER GMBH, Lichtenfels (DE)

(72) Inventor: Viktor Kremer, Lichtenfels (DE)

(73) Assignee: CONCEPT LASER GMBH, Lichtenfels (DE)

( * ) Notice: Subject to any disclaimer, the term of this patent is extended or adjusted under 35 U.S.C. 154(b) by 321 days.

(21) Appl. No.: 16/154,620

(22) Filed: Oct. 8, 2018

(65) Prior Publication Data
US 2019/0143593 A1 May 16, 2019

(30) Foreign Application Priority Data
Nov. 16, 2017 (EP) .................................. 17202194

(51) Int. Cl.
| | | |
|---|---|---|
| *B29C 64/25* | (2017.01) | |
| *B29C 64/214* | (2017.01) | |
| *B29C 64/153* | (2017.01) | |
| *B33Y 10/00* | (2015.01) | |
| *B33Y 30/00* | (2015.01) | |

(Continued)

(52) U.S. Cl.
CPC .............. *B29C 64/25* (2017.08); *B22F 12/00* (2021.01); *B29C 64/153* (2017.08); *B29C 64/214* (2017.08); *B33Y 10/00* (2014.12); *B33Y 30/00* (2014.12); *G06F 30/00* (2020.01); *B22F 10/10* (2021.01); *C04B 2235/6026* (2013.01)

(58) Field of Classification Search
CPC ................................ B29C 64/25; B33Y 10/00
See application file for complete search history.

(56) References Cited

U.S. PATENT DOCUMENTS

| 9,969,002 B2 | 5/2018 | Amaya et al. |
| 2002/0079601 A1* | 6/2002 | Russell ................. B29C 64/165 |
| | | 264/40.1 |

(Continued)

FOREIGN PATENT DOCUMENTS

| CA | 2971322 A1 | 11/2017 |
| DE | 102012012412 A1 | 3/2014 |

(Continued)

OTHER PUBLICATIONS

European Search Opinion Corresponding to Application No. 17202194.1.

(Continued)

*Primary Examiner* — Nicholas R Krasnow
(74) *Attorney, Agent, or Firm* — Dority & Manning, P.A.

(57) ABSTRACT

Apparatus (1) for additively manufacturing of three-dimensional objects by means of successive layerwise selective irradiation and consolidation of layers of a build material which can be consolidated by means of an energy source, which apparatus (1) comprises a tool carrier device (2) adapted to position at least one tool unit (3) inside a process chamber (4) of the apparatus (1), wherein the tool carrier device (2) comprises at least one, in particular exchangeable, tool unit (3) that is moveable between a retracted position in which the tool unit (3) is received in a tool housing (6) enclosing the tool unit (3) and an extended position in which the tool unit (3) is at least partly extended from the tool housing (6).

13 Claims, 3 Drawing Sheets

(51) Int. Cl.
*G06F 30/00* (2020.01)
*B22F 12/00* (2021.01)
*B22F 10/10* (2021.01)

(56) References Cited

U.S. PATENT DOCUMENTS

| | | | |
|---|---|---|---|
| 2008/0156263 A1* | 7/2008 | Montero-Escuder | ... B22F 10/20 |
| | | | 118/695 |
| 2016/0101469 A1 | 4/2016 | Kawada et al. | |
| 2017/0136545 A1 | 5/2017 | Yoshimura et al. | |
| 2017/0182712 A1 | 6/2017 | Scribner et al. | |
| 2018/0297271 A1* | 10/2018 | Maier | ................... B29C 64/118 |

FOREIGN PATENT DOCUMENTS

| | | |
|---|---|---|
| EP | 3112056 A1 | 1/2017 |
| JP | 2015182176 A | 10/2015 |
| JP | 2015796264 A | 11/2015 |
| JP | 2017/039230 A | 2/2017 |

OTHER PUBLICATIONS

European Search Report Corresponding to Application No. 17202194 dated Feb. 13, 2018.
Japanese Office Action Corresponding to Application No. 2018128944 dated May 21, 2019.
Machine Translated Chinese Search Report Corresponding to Application No. 201810058636 dated Aug. 28, 2020.
Machine Translated Chinese Office Action Corresponding to Application No. 201810058636 dated Sep. 3, 2020.

* cited by examiner

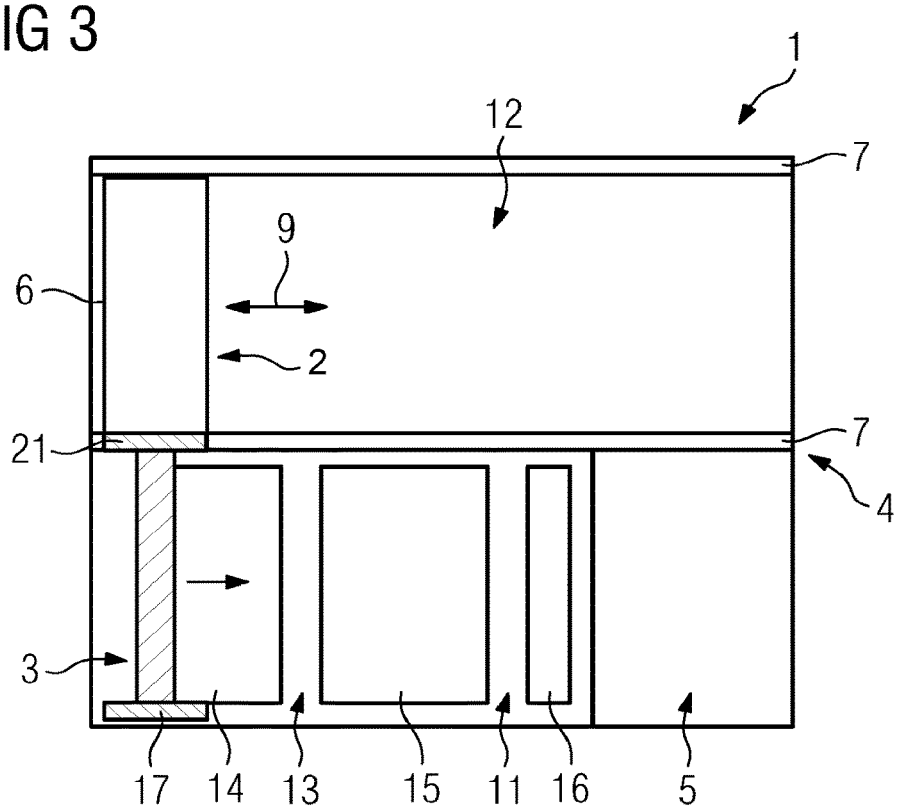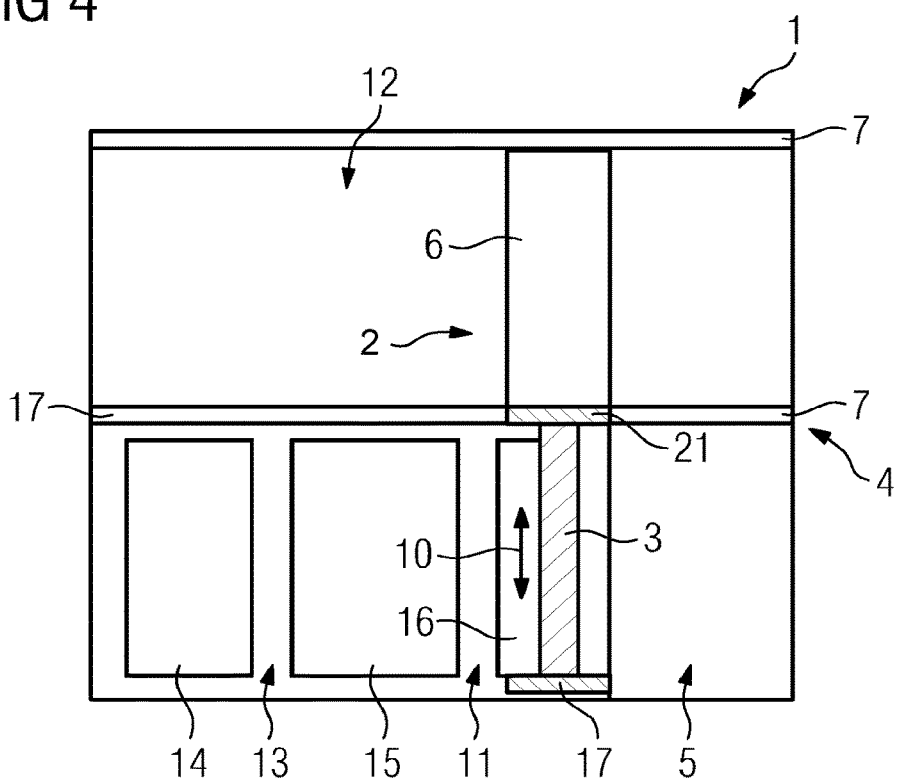

APPARATUS FOR ADDITIVELY MANUFACTURING OF THREE-DIMENSIONAL OBJECTS

CROSS-REFERENCE TO RELATED APPLICATIONS

This application claims priority to European Patent Application serial no. 17 202 194.1 filed Nov. 16, 2017, the contents of which is incorporated herein by reference in its entirety as if set forth verbatim.

The invention relates to an apparatus for additively manufacturing of three-dimensional objects by means of successive layerwise selective irradiation and consolidation of layers of a build material which can be consolidated by means of an energy source, which apparatus comprises a tool carrier device adapted to position at least one tool unit inside a process chamber of the apparatus.

Such apparatuses for additively manufacturing three-dimensional objects are generally known from prior art comprising tool carrier devices to interact with a component of the apparatus arranged inside the process chamber. To interact with the respective component, the carrier device is adapted to move or position, respectively, at least one tool unit inside the process chamber of the apparatus to interact with the component.

An exemplary tool unit may be an application unit, such as a coater, in particular a coating blade that is moved inside the process chamber to convey build material from a dose plane to a build plane. By performing the application task, build material can adhere to the coater. Thus, if the application unit is moved inside the process chamber, in particular into a region of the process chamber, e.g. a parking position of the application unit, it is possible that build material is transferred into such regions of the process chamber. This may lead to a contamination of regions of the process chamber in which build material is not desired. Especially, if reactive build material is used, the respective regions that have been contaminated with build material or other residues, respectively, have to be cleaned.

It is an object to provide an apparatus for additively manufacturing of three-dimensional objects, wherein the contamination of regions of the apparatus can be reduced or avoided.

The object is inventively achieved by an apparatus according to claim 1. Advantageous embodiments of the invention are subject to the dependent claims.

The apparatus described herein is an apparatus for additively manufacturing three-dimensional objects, e.g. technical components, by means of successive selective layerwise consolidation of layers of a powdered build material ("build material") which can be consolidated by means of an energy source, e.g. an energy beam, in particular a laser beam or an electron beam. A respective build material can be a metal, ceramic or polymer powder. A respective energy beam can be a laser beam or an electron beam. A respective apparatus can be a selective laser sintering apparatus, a selective laser melting apparatus or a selective electron beam melting apparatus, for instance. Alternatively, the successive layerwise selective consolidation of build material may be performed via at least one binding material. The binding material may be applied with a corresponding application unit and, for example, irradiated with a suitable energy source, e.g. a UV light source.

The apparatus may comprise a number of functional units which are used during its operation. Exemplary functional units are a process chamber, an irradiation device which is adapted to selectively irradiate a build material layer disposed in the process chamber with at least one energy beam, and a stream generating device, as described before, which is adapted to generate a gaseous fluid stream at least partly streaming through the process chamber with given streaming properties, e.g. a given streaming profile, streaming velocity, etc. The gaseous fluid stream is capable of being charged with non-consolidated particulate build material, particularly smoke or smoke residues generated during operation of the apparatus, while streaming through the process chamber. The gaseous fluid stream is typically inert, i.e. typically a stream of an inert gas, e.g. argon, nitrogen, carbon dioxide, etc.

The invention is based on the idea that the tool carrier device comprises at least one, in particular exchangeable, tool unit that is movable between a retracted position in which the tool unit is received in a tool housing and an extended position in which the tool unit is at least partly extended from the tool housing. According to the invention, it is suggested to provide a tool housing in which the tool unit can be housed or from which the tool unit can be extended (moved) into the process chamber. The term "extended" does not limit the movement of the tool unit to linear movements going out of the tool housing. Instead, an arbitrary movement of the tool unit relative to the tool housing is possible. For example, the tool unit may be moved out of the tool housing and arbitrarily moved inside the process chamber. Afterwards, the tool unit may be moved back into the retracted position, i.e. into the tool housing.

The tool housing therefore, provides an at least partial enclosure for the tool unit in which the tool unit can be retracted (moved back into the tool housing) after the interaction with a respective component of the apparatus inside the process chamber is finished. In other words, the tool unit may be moved out of the tool housing to interact with a component inside the process chamber of the apparatus and can be moved back into the tool housing afterwards. The tool housing may reduce or avoid the contamination of regions of the process chamber due to build material or residues adhered to the tool unit after the tool unit has been positioned or moved through the process chamber. For example, it is possible that the tool housing provides a "parking position" for the tool unit, wherein build material or other residues can be received by the tool housing and do not contaminate other regions of the process chamber.

Preferably, the tool housing may be movable relative to the process chamber, in particular linearly movable along at least one process chamber wall. According to this embodiment of the apparatus, the tool housing itself may be moved relative to the process chamber, in particular with the tool unit inside the tool housing. It is also possible to move the tool housing with the tool unit outside the tool housing. Generally, the movement of the tool housing and the movement of the tool unit are independent of each other. However, it is preferred that the tool housing is moved with the tool unit inside the tool housing to the position in which the tool unit is operated inside the process chamber. Accordingly, it is preferred that after the interaction of the tool unit inside the process chamber is performed, the tool unit is moved back into the tool housing. Especially, if the tool unit has to be moved through regions in which a contamination with build material or other residues, such as smoke or smolder, is critical, it is preferred that the tool unit is transported inside the tool housing via a corresponding movement of the tool housing carrying the tool unit in its inside.

For example, at least one guide element, in particular linear guide bars or rails, may be provided that allow for a positioning of the tool housing relative to the process chamber. Such guide elements may be arranged in parallel to at least one wall of the process chamber, wherein the tool housing may be moved along the guide bars or rails essentially in parallel to the corresponding wall of the process chamber. The movement of the tool unit may be performed independent of the movement of the tool housing, e.g. via a drive device assigned to the tool unit that is adapted to move the tool unit out of the tool housing, inside the process chamber and back into the tool housing. Such a drive device may be arranged inside the tool housing.

Further, the apparatus may be improved in that with the tool unit in the retracted position, the inside of the tool housing is sealed against the environment, in particular against the process chamber. According to this embodiment, the tool housing provides a complete enclosure of the tool unit, if the tool unit is positioned in the retracted position, i.e. inside the tool housing. The tool housing therefore, limits a closed volume in which the tool unit can be received or housed, respectively. Residues sticking to the tool unit, such as build material sticking on a coater, due to the interaction of the tool unit with a component inside the process chamber therefore, cannot leave the tool housing. The residues taken with the tool unit into the tool housing do not contaminate a region of the process chamber (other than the inside of the tool housing).

Thus, the contamination caused by a movement of the tool carrier device, in particular a movement of the tool unit, can be reduced or even avoided as it is possible that all the residues, in particular the build material taken out of the process chamber via the tool unit, are received in the tool housing and do not fall off the tool unit in random positions in the apparatus. This further reduces the cleaning effort, since only the tool housing has to be cleaned (emptied) or exchanged, instead of a whole housing of the apparatus that is contaminated at least along the movement path of the tool unit.

To provide the sealing against the environment a gate may be provided sealing an opening of the tool housing. The gate may be opened to allow the tool unit to pass through the opening in the tool housing and may be closed with the tool unit in the retracted position. It is also possible that the gate may be designed in that it is permeable for the tool unit, for example a permeable flexible elastic membrane or a brush, wherein the tool unit passing the gate is adapted to deform the gate and wherein the gate closes elastically after the tool unit is back in the retracted position. Such a permeable gate further allows for a wiping off of residues adhered to the tool unit as the permeable gate tightly encloses the tool unit. A wiping movement wiping the residues off the tool unit can be achieved via a movement of the tool unit relative to the gate.

According to another embodiment of the apparatus, a tool housing cover may be provided that is connected with the tool unit, which tool housing cover is adapted to seal the tool housing with the tool unit in the retracted position. Therefore, the tool housing cover is (directly) connected to the tool unit and closes (seals) the opening in the tool housing, if the tool unit is in the retracted position, i.e. inside the tool housing. A movement of the tool unit relative to the tool housing causes the tool housing cover to be moved, in particular lifted, from the tool housing. With the tool housing cover lifted off the opening in the tool housing, the tool unit is free to pass the opening in the tool housing.

Accordingly, when the tool unit is retracted into the tool housing, the tool housing cover attached to the tool unit is again put onto the opening of the tool housing and therefore, closes the opening of the tool housing. Thus, by having the tool housing cover, which can be considered as a "gate", attached to the tool unit it is ensured that the tool housing is sealed against the environment, in particular against a volume of the apparatus surrounding the tool housing, with the tool unit in the retracted position and that the tool unit may be moved out of the tool housing without the need of opening the gate in advance. For example, the tool housing cover may be attached to a free end of the tool unit, i.e. an end of the tool unit facing the opening with the tool unit in the retracted position.

Further, another tool housing cover may be provided that is adapted to seal the opening in the tool housing with the tool unit in the extended position. In other words, the two tool housing covers may be arranged in different, in particular opposing, sections of the tool unit. With the tool unit in the retracted position, the tool housing cover facing the process chamber seals the opening in the tool housing. With the tool unit in the extended position, the tool housing cover arranged in the other section of the tool unit seals the opening in the tool housing. Thus, the opening in the tool housing may be sealed with the tool unit in the extended position as well as with the tool unit in the retracted position.

The process chamber of the apparatus further may be separated via a separation device into a first process chamber region in which a process plane is arranged and a second process chamber region in which the tool housing is or maybe movably arranged. By providing the separation device the chamber may be separated into two regions, in particular into a first process chamber region and a second process chamber region. The first process chamber region may comprise the region of the process chamber, in which the actual manufacturing process is performed, i.e. in which a process plane is arranged on which at least one object is additively built. As process plane the plane of the process chamber may be understood that comprises the dose plane (an upper surface of build material provided by a dose module) and/or the build plane (surface of build material in which the object is layerwise consolidated).

Thus, the process chamber can be separated into a first process chamber region in which the object is manufactured and in which therefore, build material and other residues are present and a second process chamber region that can generally be kept free of residues, such as smoke, smolder or build material. The tool unit therefore, interacts in the first process chamber region with a component of the apparatus, in particular the tool unit may be used as an application unit conveying (fresh) build material from the dose plane to the build plane, wherein build material may adhere to the tool unit. If the interaction of the tool unit with the component of the apparatus in the first process chamber region is finished, the tool unit may be retracted into the tool housing that may be arranged in the second process chamber region.

With the tool unit in the retracted position the tool housing may be moved in the second process chamber region, wherein a contamination of the second process chamber region is reduced or avoided, since the tool unit is enclosed by the tool housing and therefore, sealed against the second process chamber region. All residues falling off the tool unit inside the tool housing are received in the tool housing and do not contaminate another region of the apparatus.

According to another embodiment of the invention, a sealing unit may be provided that is adapted to seal the first process chamber region against the second process chamber region, wherein the sealing unit is further deformable and/or moveable dependent on a movement and/or a position of the tool carrier device, in particular the tool unit. The sealing unit according to this embodiment is provided for sealing the first process chamber region against the second process chamber region. The sealing adapts to the position of the tool carrier device, in particular the tool housing, wherein the sealing unit is deformable and/or movable dependent on a movement and/or a position of the tool carrier device, in particular the tool housing.

For example, the sealing unit may be built as a belt or a bellows moving and/or deforming upon a movement of the tool housing. The sealing unit may further be deformable, for example by being built as an elastic element or by being built as a brush. Thus, the tool housing may deform the sealing unit upon a movement in that the first process chamber region is sealed against the second process chamber region even if the tool housing is moved. The sealing unit may further allow for the tool unit to protrude the sealing unit and therefore, pass from the tool housing which is arranged in the second process chamber region into the first process chamber region.

Preferably, the chamber separation comprises the sealing unit, wherein the sealing unit is arranged in a lower portion of the chamber separation above the process plane. Therefore, the sealing unit is integrated in the chamber separation or attached thereto, preferably in a lower portion of the chamber separation. Thus, the sealing unit is arranged above the process plane in that the tool unit protruding the sealing unit can access the process chamber, in particular the process plane inside the first process chamber region.

Further, the gate or the tool housing cover may be built as a segment of the sealing unit completing the sealing unit with the gate or the tool housing cover in the closed position, i.e. with the tool unit in the retracted position. Hence, the gate or the tool housing cover may be considered as part of the sealing unit being separated from the rest of the sealing unit for moving the tool unit from the retracted position to the extended position and moving the gate or the tool housing cover back into place and completing the seating unit by moving the tool unit from the extended position back into the retracted position.

The apparatus can further be improved in that a cleaning unit is provided that is adapted to clean the at least one tool unit, in particular adapted to remove residues from the at least one tool unit. The cleaning unit may, for example, be provided in a tool exchange region of the apparatus, in which the tool unit of the tool carrier device can be exchanged by other tool units. By cleaning the tool unit, the residues attached to the tool unit can be removed and therefore, guided off the process chamber.

The apparatus may further comprise a receiving unit arranged in the tool housing, which receiving unit is adapted to receive and/or guide off residues, in particular residues that are removed from the tool unit. Thus, the receiving unit is adapted to receive residues, such as smoke, smolder or build material that adhered to the tool unit upon interaction of the tool unit in the first process chamber region, i.e. a region of the process chamber containing the process plane. The receiving unit may be cleaned or emptied or the receiving unit may be replaced with an empty receiving unit in that residues received in the receiving unit can be guided off the process chamber.

Additionally, the apparatus may comprise a replacing unit adapted to replace the tool unit. The replacing unit may be provided to replace the tool unit by a fresh or new tool unit, e.g. if the tool unit shows signs of wear or is worn. Thus, the replacing unit may replace the current tool unit in that the current tool unit is exchanged with a fresh tool unit or a recycled tool unit.

Further, it is possible that the cleaning unit and/or the replacing unit are arranged inside the tool housing or in that the cleaning unit and/or the replacing unit are arranged outside the tool housing, in particular in a tool exchange region of the process chamber.

Preferably, the tool carrier device is built as application device adapted to apply build material onto at least one build plane, wherein the tool unit is built as a coater. For coating the build plane, the tool housing may be positioned with the tool unit in the retracted position along the respective process chamber wall into a position along the dose plane, in particular to the side opposing the build plane side. In this "dose position" the tool unit may be moved from the retracted position into the extended position. By moving the tool housing and together with the tool housing the tool unit (in the extended position) over the dose plane build material is picked up from the dose plane and conveyed to the build plane.

After the build material is conveyed to the build plane the tool unit may further be moved over the dose module to deploy excess build material into the overflow chamber. Afterwards, the tool unit may be moved from the extended position to the retracted position, i.e. back into the tool housing. The tool housing may then be moved back to the dose position to complete the application cycle or the tool housing maybe moved to a park position or a tool exchange position.

Besides, the invention relates to a tool carrier device, in particular for an apparatus for additively manufacturing of three-dimensional objects by means of successive layerwise selective irradiation and consolidation of layers of a build material which can be consolidated by means of an energy source, preferably an inventive apparatus, as described before, which tool carrier device is adapted to position at least one tool unit inside a process chamber of the apparatus, wherein the tool carrier device comprises at least one, in particular exchangeable, tool unit that is moveable between a retracted position in which the tool unit is received in a tool housing enclosing the tool unit and an extended position in which the tool unit is at least partly extended from the tool housing.

Additionally, the invention relates to a method for operating at least one apparatus for additively manufacturing three-dimensional objects by means of successive layerwise selective irradiation and consolidation of layers of a build material which can be consolidated by means of an energy source, which apparatus comprises a tool carrier device adapted to position at least one tool inside a process chamber of the apparatus, wherein the method is performed on an inventive apparatus.

The inventive method preferably comprises the following steps:
  a tool housing is moved to an extension position, in particular a position of a dose plane and/or
  a tool unit, in particular a coater, is moved from a retracted position to an extended position, in particular from the tool housing into the process chamber and/or
  the tool unit is moved relative to the process chamber, in particular over a dose plane and a build plane, wherein fresh build material is conveyed from the dose plane onto the build plane and/or the tool unit is retracted from the extended position to the retracted position in a retraction position and/or the tool housing is moved to the extension position or to a tool exchange region.

Self-evidently, all features, details and advantages described with respect to the inventive apparatus are fully to transferable to the inventive tool carrier device and the inventive method for operating an apparatus for additively manufacturing three-dimensional objects.

Exemplary embodiments of the invention are described with reference to the FIG. The FIG. are schematic diagrams, wherein FIG. 1 shows an inventive apparatus in top view of an inventive tool carrier device in a first position;

FIG. 3 shows the inventive apparatus of FIG. 1, 2 with the tool carrier device in a third position;

FIG. 4 shows the inventive apparatus of FIGS. 1 to 3 with the tool carrier device in a fourth position.

Figure 1:
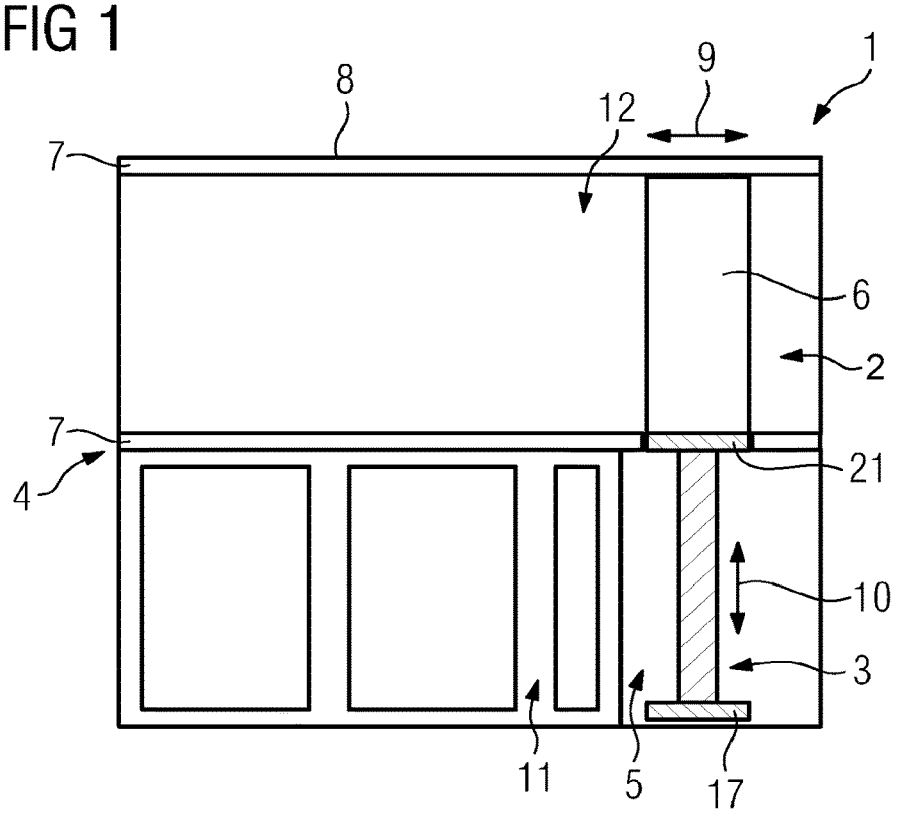

FIG. 1 shows a top view of an apparatus 1 for additively manufacturing of three-dimensional objects by means of successive layerwise selective irradiation and consolidation of layers of a build material which can be consolidated by means of an energy source, for example a laser beam. The apparatus 1 comprises a tool carrier device 2 that is adapted to position a tool unit 3 inside a process chamber 4 of the apparatus 1.

The tool unit 3 of the tool carrier device 2 is exchangeable and is built as coater in the embodiment shown in the FIGS. 1-5. The tool carrier device 2 can therefore, be deemed as application device. Of course, it is possible to change the tool unit 3 in that the tool carrier device 2 is adapted to perform other tasks then applying build material, i.e. interacting with various components inside the process chamber 4. However, the function of the apparatus 1 is described with respect to the tool unit 3 being built as a coater.

FIG. 1 shows the tool unit 3 being positioned in a tool exchange region 5 in which via a corresponding replacing unit the tool unit 3 can be replaced by other tool units 3, in particular of the same kind or other kinds of tools can therefore, be attached to the tool carrier device 2. The tool carrier device 2 further comprises a tool housing 6 that is movable along two rails 7, in particular arranged in parallel to a process chamber wall 8 of the process chamber 4 of the apparatus 1 (as indicated by an arrow 9). The tool unit 3 is depicted in an extended position in which the tool unit 3 is positioned outside the tool housing 6. The tool unit 3 can be retracted into the retracted position, i.e. moved into the tool housing 6, as indicated by an arrow 10.

Figure 2:
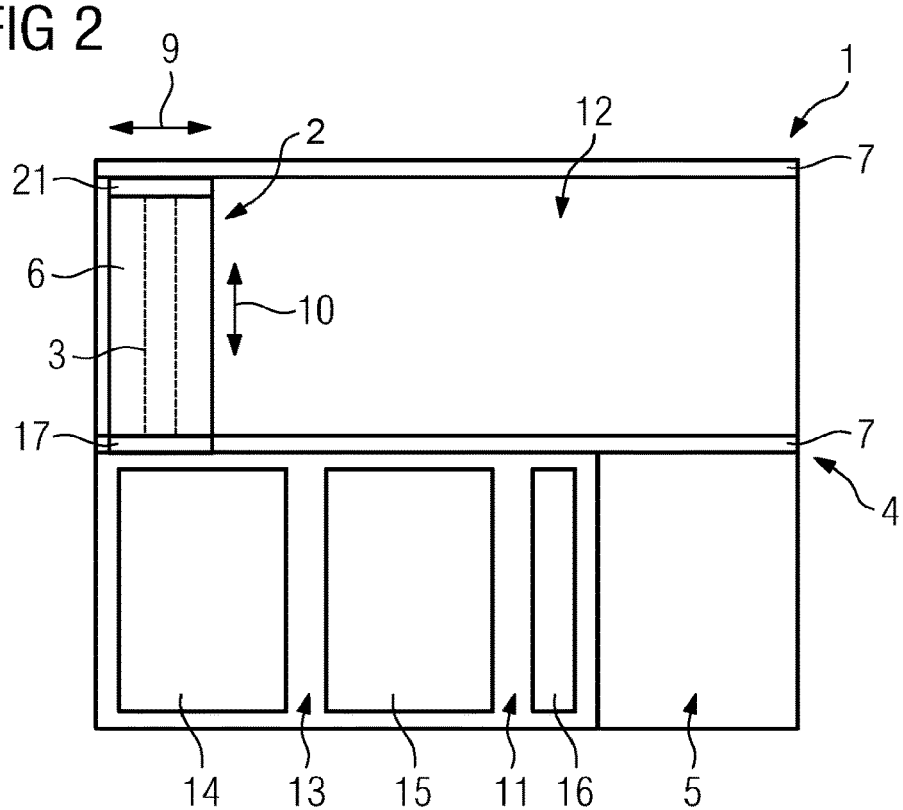
FIG. 2 shows the inventive apparatus of FIG. 1 with the tool carrier device in a second position.

FIG. 2 shows the tool carrier device 2 with the tool unit 3 positioned in the retracted position and therefore, housed inside the tool housing 6. The tool housing 6 therefore, provides an enclosure for the tool unit 3 in which the tool unit 3 is sealed against the environment around the tool housing 6. The process chamber 4 of the apparatus 1 according to this embodiment is sub-divided into a first process chamber region 11 and a second process chamber region 12. The first process chamber region 11 can be deemed as the region in which objects are additively manufactured, i.e. in which the additive manufacturing process is performed. A process plane 13 is arranged inside the first process chamber region 11 comprising a dose plane 14 of a dose module, a build plane 15 of a build module and an overflow opening 16 of an overflow module.

The tool housing 6 of the tool carrier device 2 is movable inside the second process chamber region 12 along the rails 7, as depicted by the arrow 9. The position depicted in FIG. 2 can be deemed as "dose position", as the tool unit 3 can be placed in a position along the process plane 13 in advance to the dose plane 14. In this position the tool unit 3 is in the retracted position and can be moved from the retracted position into the extended position, as depicted by an arrow 10. The position of the tool housing 6, as depicted in FIG. 2, may also be referred as "extension position" as the tool unit 3 is to be extended from the retracted position into the extended position.

FIG. 3 shows the tool housing 6 in the "dose position", wherein the tool unit 3 was moved from the retracted position as depicted in FIG. 2 into the extended position (movement as indicated by the arrow 10). In this position the tool unit 3, in particular the blade of the coater, is positioned in advance to the dose plane 14. Starting from this position the tool housing 6 can be moved along the arrow 9, wherein the tool unit 3 picks up build material from the dose plane 14 and conveys the build material to the build plane 15.

By passing the build plane 15 the build material that was picked up from the dose plane 14 is distributed on the build plane 15, wherein a fresh layer of build material is applied onto the build plane 15. Surplus build material is further conveyed towards the overflow opening of the overflow module 16 and is depleted into the overflow opening 16. FIG. 4 shows the tool carrier device 2 in the position after the coating step has been performed, in other words the tool unit 3 is arranged behind (in coating direction) the opening 16 of the overflow module.

In this position the tool unit 3 can be moved from the extended position to the retracted position, by moving along the arrow 10. In other words, the tool unit 3 can be moved back into the tool housing 6. Subsequently, the tool housing 6 can be moved back into the dose position, as depicted in FIG. 2. Accordingly, several coating steps or application steps can be performed while the steps depicted in the FIGS. 2 to 4 are repeated. It is also possible to move the tool carrier device 2 back into the position in the tool exchange region 5, as depicted in FIG. 1, if a change of the tool unit 3 is necessary. The position of the tool housing 6, as depicted in FIG. 4, may also be referred as "retraction position" as the tool unit 3 is to be retracted from the extended position into the tool housing 6.

By providing the tool housing 6 it is assured that the tool unit 3 that is moved out of the first process chamber region 11 into the second process chamber region 12 does not carry build material or other residues, such as smoke or smolder from the first process chamber region 11 to other process chamber regions 12. Thus, a contamination of other regions of the apparatus 1 can be reduced or avoided. Instead of spreading the build material and other residues throughout the apparatus 1, the residues and the build material are received in the tool housing 6. The tool housing 6 can comprise a receiving unit for receiving the build material and the residues (not shown).

The tool housing 6 can further be provided with a cleaning unit that is adapted to clean the tool unit 3 and, for example, wipe off build material adhered to the tool unit 3, before the tool unit 3 is again moved from the retracted position into the extended position and therefore, again enters the first process chamber region 11.

Figure 5:
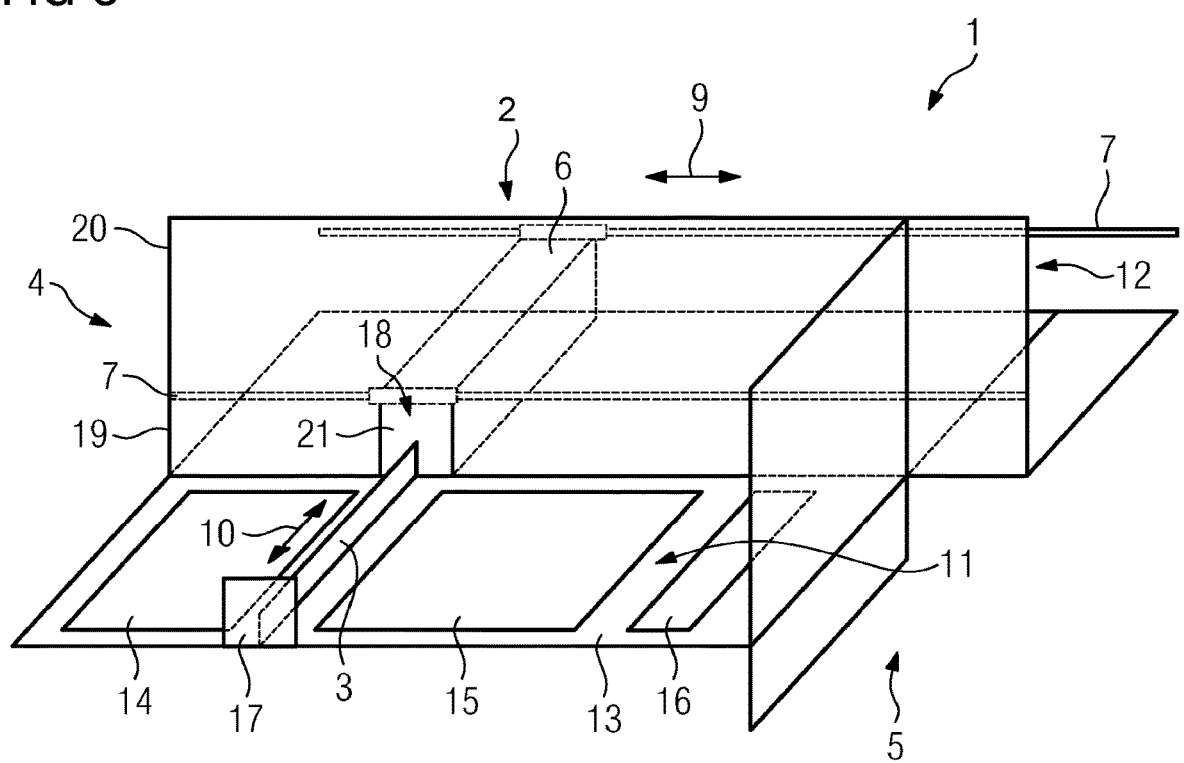
FIG. 5 shows a perspective view of the inventive apparatus.

FIG. 5 shows a perspective view of a detail of the apparatus 1, in particular the process chamber 4 of the apparatus 1. As can be derived from FIG. 5, the tool unit 3 is coupled with a tool housing cover 17 which is adapted to cover an opening 18 in the tool housing 6. The tool housing cover 17 is part of a sealing 19 which is built as a movable belt and can be considered as being part of a chamber separation 20 separating the process chamber 4 into the first process chamber region 11 and the second process chamber region 12. If the tool unit 3 is moved from the extended position, as depicted in FIG. 5, into the retracted position, the tool housing cover 17 completes the sealing 19. If the tool housing 6 is moved relative to the process chamber 4, as indicated by the arrow 9, the sealing 19 is moved together with the tool housing 6.

Further, as can be derived from the FIG., another tool housing cover 21 may be provided that is adapted to seal the opening 18 in the tool housing 6 with the tool unit 3 in the extended position (FIGS. 1, 3-5). In other words, the two tool housing covers 17, 21 may be arranged in different, in particular opposing sections of the tool unit 3, for example at the ends of the tool unit 3. With the tool unit 3 in the retracted position (FIG. 2), the tool housing cover 17 facing the first process chamber region 11 seals the opening 18 in the tool housing 6. With the tool unit 3 in the extended position (FIGS. 1, 3-5), the tool housing cover 21 arranged in the opposite section of the tool unit 3, i.e. facing the second process chamber region 12, seals the opening 18 in the tool housing 6. Thus, the opening 18 in the tool housing 6 may be sealed with the tool unit 3 in the extended position as well as with the tool unit 3 in the retracted position.

The apparatus is, self-evidently, adapted to perform the inventive method.

The invention claimed is:

1. An apparatus for additively manufacturing three-dimensional objects, the apparatus comprising:
   a process chamber;
   a process chamber separation element, the process chamber separation element configured to separate the process chamber into a first process chamber region and a second process chamber region, wherein the first process chamber region comprises a process plane for additively manufacturing a three-dimensional object;
   a tool housing moveable within the second process chamber region; and
   a tool carrier device configured to position a tool unit carried by the tool carrier device inside the process chamber, wherein the tool carrier device is configured to be moveable between:
      a retracted position wherein the tool unit is received in the tool housing; and
      an extended position wherein the tool unit is at least partly extended from the tool housing,
   wherein the tool unit comprises a coater blade configured to convey build material from a dose plane of a dose module to the build plane of the build module.

2. The apparatus of claim 1, wherein the tool housing is moveable relative to the process chamber.

3. The apparatus of claim 1, wherein the retracted position comprises the tool housing being sealed against an environment of the process chamber.

4. The apparatus of claim 1, comprising:
   a tool housing cover configured to seal the tool housing with the tool unit in the retracted position.

5. The apparatus of claim 1, comprising:
   a sealing unit configured to seal the first process chamber region from the second process chamber region, wherein the sealing unit is deformable and/or moveable in connection with a movement and/or a position of the tool carrier device and/or of the tool unit.

6. The apparatus of claim 5, wherein the process chamber separation element comprises the sealing unit, wherein the sealing unit is arranged in a lower portion of the process chamber separation element, the lower portion of the process chamber separation element being located above the process plane.

7. The apparatus of claim 1, wherein the tool unit comprises a plurality of exchangeable tools.

8. The apparatus of claim 1, wherein the tool housing is linearly moveable along at least one process chamber wall.

9. The apparatus of claim 1, wherein the tool housing cover is coupled to the tool unit.

10. A method of additively manufacturing a three-dimensional object, the method comprising:
   separating, with a process chamber separation element, a process chamber of an apparatus for additively manufacturing three-dimensional objects into a first process chamber region and a second process chamber region, wherein the first process chamber region comprises a process plane for additively manufacturing a three-dimensional object; and
   positioning a tool unit inside the process chamber, the tool unit being carried by a tool carrier device and the tool carrier device configured to position the tool unit, wherein positioning the tool unit comprises:
      moving the tool carrier device, at least in part within the second process chamber region, between a retracted position and an extended position, the retracted position comprising the tool unit being received in a tool housing and the extended position comprising the tool unit being at least partly extended from the tool housing, wherein the tool unit comprises a coater blade configured to convey build material from a dose plane of a dose module to the build plane of the build module.

11. The method of claim 10, comprising:
   moving the tool carrier to the extended position, wherein moving the tool carrier to the extended position comprises locating the tool unit above a dose plane of a dose module; and
   conveying build material from the dose plane to a build plane of a build module, wherein the tool unit comprises a coater blade configured to convey the build material.

12. The method of claim 10, comprising:
   moving the tool carrier from the retracted position to the extended position, wherein moving the tool carrier to the extended position comprises moving the tool housing into the process chamber.

13. The method of claim 10, comprising:
   moving the tool carrier from the extended position to the retracted position, wherein the tool unit being in the retracted position and received in the tool housing comprises the tool housing being sealed against an environment of the process chamber.

* * * * *